(12) United States Patent
Maki

(10) Patent No.: US 6,650,262 B2
(45) Date of Patent: Nov. 18, 2003

(54) AD CONVERTER EVALUATION APPARATUS

(75) Inventor: Tomotaka Maki, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 10/127,281

(22) Filed: Apr. 22, 2002

(65) Prior Publication Data

US 2002/0171570 A1 Nov. 21, 2002

(30) Foreign Application Priority Data

Apr. 23, 2001 (JP) .................................... P. 2001-124906

(51) Int. Cl.[7] .................................................. H03M 1/66
(52) U.S. Cl. ...................... 341/120; 341/145; 324/607
(58) Field of Search ........................ 324/607; 341/120, 341/145

(56) References Cited

U.S. PATENT DOCUMENTS

| | | | | |
|---|---|---|---|---|
| 3,648,175 A | * | 3/1972 | Barnard et al. ............. | 341/120 |
| 5,138,267 A | * | 8/1992 | Komagata et al. .......... | 324/120 |
| 5,977,774 A | * | 11/1999 | Noble et al. ................. | 324/607 |
| 6,131,074 A | * | 10/2000 | Kawai ......................... | 702/107 |
| 6,498,507 B1 | * | 12/2002 | Meany et al. ................ | 324/763 |

\* cited by examiner

*Primary Examiner*—Howard L. Williams
(74) *Attorney, Agent, or Firm*—Fish & Richardson P.C.

(57) ABSTRACT

An AD converter evaluation apparatus evaluates an AD converter, which includes a first programmable power supply, a second programmable power supply, an attenuator circuit, an addition circuit, and a digital multimeter. The first and second programmable power supplies sets a first and second voltages. The attenuator circuit attenuates the first voltage of the second programmable power supply. The addition circuit adds the first voltage of the first programmable power supply and the attenuated voltage of the attenuator circuit. The digital multimeter measures the first voltage of the first programmable power supply and the second voltage of the second programmable power supply. Output voltage of the addition circuit is input to the AD converter.

7 Claims, 4 Drawing Sheets

AD CONVERTER EVALUATION APPARATUS

BACKGROUND OF THE INVENTION

1. Field of the Invention

This invention relates to an AD converter evaluation apparatus and in particular to a high-resolution AD converter evaluation apparatus for automatically measuring an AD converter to be measured using a computer, etc.

2. Description of the Related Art

FIG. 4 shows an AD converter evaluation apparatus in a related art. The AD converter evaluation apparatus will be discussed.

An AD converter evaluation apparatus 40 in the related art automatically measures an AD converter 50 to be measured using a computer 43, etc. The AD converter evaluation apparatus 40 has a programmable power supply 41, a controller 42 connected to the computer 43 by a PCI bus 45, a buffer amplifier 49, and the AD converter 50, as shown in FIG. 4.

The controller 42 has a GPIB interface 47 connected to the programmable power supply 41 by a GPIB cable 44 and an I/O interface 46 connected to the AD converter 50 by an AD converter conversion start signal line 48.

Thus, output of the programmable power supply 41 is connected to the buffer amplifier 49, an output signal of the buffer amplifier 49 is input to the AD converter 50, and an AD converter conversion start signal is transmitted from the controller 42 for controlling and evaluating the AD converter 50.

To evaluate the AD converter, the precision of the signal source need be higher precision about four bits than the number of output bits of the AD converter to be measured.

Thus, it is very difficult to provide a programmable power supply to evaluate an AD converter having a resolution of 12 bits or more.

For example, to measure an AD converter with output 0 to 5 V having a resolution of 16 bits, it becomes necessary to set a voltage finer than 4.75 $\mu$V.

SUMMARY OF THE INVENTION

It is therefore an object of the invention to provide an AD converter evaluation apparatus that can produce programmable power supply having a high resolution required for measuring an AD converter to be measured.

According to the present invention, there is provided an AD converter evaluation apparatus for evaluating an AD converter, including:

a first programmable power supply for applying a first voltage;

a second programmable power supply for applying a second voltage;

an attenuator circuit for attenuating the second voltage output from the second programmable power supply to generate a third voltage;

an addition circuit for adding the third voltage of the attenuator circuit to the first voltage output from the first programmable power supply to generate a fourth voltage; and a digital multimeter for measuring the first voltage of the first programmable power supply and the second voltage of the second programmable power supply, wherein the fourth voltage of the addition circuit is input to the AD converter.

Accordingly, the output of one programmable power supply is attenuated by the attenuator circuit and the result and the output of the other programmable power supply are added together, whereby higher-resolution programmable power supply can be realized and the object can be accomplished.

The AD converter evaluation apparatus further includes:

a computer; and a controller connected to the computer and connected through an interface section to the digital multimeter and the AD converter, the controller for controlling the AD converter.

Accordingly, the AD converter evaluation apparatus can be automatically controlled by the computer.

In the AD converter evaluation apparatus, the digital multimeter measures the fourth voltage of the addition circuit and outputs an actual measured voltage of the fourth voltage to the computer. The computer compares the actual measured voltage with an expected voltage of the fourth voltage programmed in the computer in advance to calculate a difference between the actual measured voltage and the expected voltage. The computer resets the first and second voltages of the first and second programmable power supplies, thereby to cancel out an error component thereof. The reset first and second voltages of the first and second programmable power supplies are input to the AD converter. The controller transmits an AD converter conversion start signal to start conversion operation of the AD converter.

Accordingly, the actual measurement value input to the digital multimeter is compared with the expected value programmed in the computer in advance, the difference between the actual measurement value and the expected value is found, and the values of the programmable power supplies are again set, whereby the measurement error can be canceled out and output voltage close to the precision of the digital multimeter can be provided.

DETAILED DESCRIPTION OF THE PRESENT INVENTION

Referring now to the accompanying drawings, there is shown an embodiments of the invention.

Figure 1:
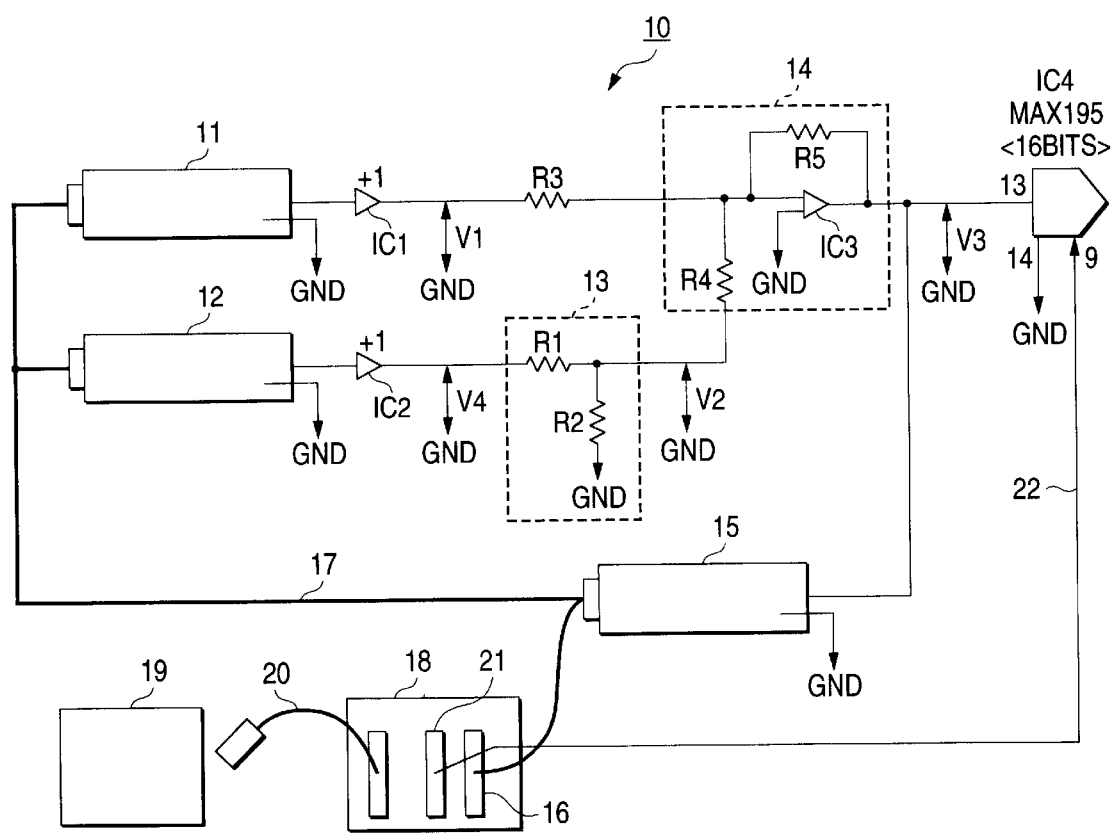
FIG. 1 is a block diagram to show an AD converter evaluation apparatus of an embodiment according to the invention.

FIG. 1 is a block diagram to show the configuration of an embodiment of an AD converter evaluation apparatus according to the invention.

An AD converter evaluation apparatus 10 has programmable power supplies 11 and 12, an attenuator circuit 13, an addition circuit 14, a digital multimeter 15, buffer amplifiers IC1 and IC2, and an AD converter IC4, as shown in FIG. 1.

In addition to the AD converter evaluation apparatus 10, a computer 19 and a controller 18 connected to the computer 19 by a PCI bus 20 can be used to automatically measure the AD converter IC4.

In the AD converter evaluation apparatus 10 shown in FIG. 1, the buffer amplifier IC1 is connected to output of the (first) programmable power supply 11. The output voltage passing through the buffer amplifier IC1 is V1.

The buffer amplifier IC2 is connected to output of the (second) programmable power supply 12. Resistors R1 and R2 forming the attenuator circuit 13 are connected to output of the buffer amplifier IC2. The output voltage passing through the attenuator circuit 13 is V2.

The addition circuit 14 made up of resistors R3, R4, and R5 and an operational amplifier IC3 adds the output voltages V1 and V2. Output voltage of the addition circuit 14 is V3. The output voltage V3 is connected to input of the AD converter IC4 and the digital multimeter 15.

The computer 19 is connected to the controller 18 by the PCI bus 20.

The controller 18 is provided with a GPIB interface 16 and an I/O interface 21, and the GPIB interface 16 is connected to the programmable power supplies 11 and 12 and the digital multimeter 15.

The I/O interface 21 is connected to the AD converter IC4 by an AD converter conversion start signal line 22.

Next, the operation and function of the AD converter evaluation apparatus according to the embodiment will be discussed.

To begin with, the output voltage of the addition circuit 14 is measured with the multimeter 15 and the actual measurement voltage value is input to the computer 19.

The input actual measurement voltage value is compared with a programmed expected voltage value.

Next, the difference between the actual measurement voltage value and the expected voltage value is found and the voltage values of the programmable power supplies 11 and 12 are again set to voltage values for canceling out the difference, thereby canceling out the error component.

The voltage values of the programmable power supplies 11 and 12 thus again set are combined into voltage V3 by the addition circuit 14 made up of the resistors R3, R4, and R5 and the operational amplifier IC3, and the voltage V3 is input to the AD converter IC4.

An AD converter conversion start signal is transmitted through the I/O interface 21 over the an AD converter conversion start signal line 22 for starting the operation of the AD converter IC4.

Thus, the output of one programmable power supply 12 is divided by the attenuator circuit 13 and the result and the output of the other programmable power supply 13 are added together, whereby higher-resolution power supply can be realized.

Next, an example of the embodiment according to the invention will be discussed in detail with reference to FIG. 2.

Figure 2:
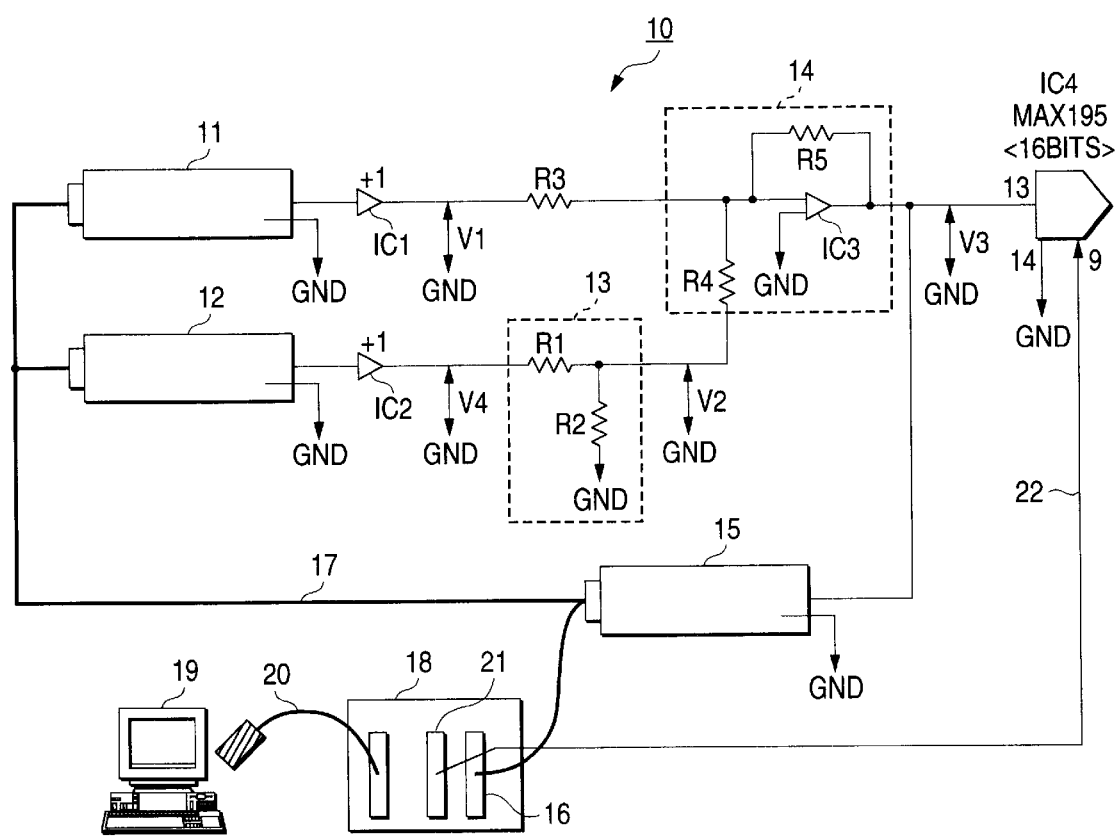
FIG. 2 is a block diagram to show the configuration of an example of the AD converter evaluation apparatus of the embodiment according to the invention.

FIG. 2 is a block diagram to show the configuration of an example of the embodiment according to the invention.

To begin with, the portion controlled through the GPIB interface 16 will be discussed.

The programmable power supplies (manufactured by YOKOGAWA: 7651) 11 and 12, the digital multimeter (manufactured by AGILENT TECHNOLOGIES: HP3458A) 15, and the GPIB interface (manufactured by NATIONAL INSTRUMENTS: PXI-GPIB) are connected by the GPIB cable 17.

The controller (manufactured by NATIONAL INSTRUMENTS: PXI-8335) 18 and the personal computer 19 are connected by the PCI bus 20.

The I/O interface 21 is connected to an AD converter conversion start signal port of the AD converter IC4.

The components are connected as described above, whereby the evaluation system of the AD converter IC4 can be all controlled on the personal computer 19.

The programmable power supplies 11 and 12 used this time provide each the maximum output 10V and the minimum resolution 100 $\mu$V. As the digital multimeter 15, a multimeter that can display up to 8 and ½ digits (100 nV) is used.

Next, the portion of the attenuator circuit 13 will be discussed.

The buffer amplifier IC2 is connected to the output of the programmable power supply 12 and the attenuator circuit 13 (R1 and R2) is connected to the output of the buffer amplifier IC2.

In the example:

$R1 = 101.0101\ \Omega \pm 0.01\%$ $R2 = 99.9\text{k}\Omega \pm 0.01\%$ $R4 = 10.0\text{k}\Omega \pm 0.01\%$ The attenuator circuit 13 is made up of the resistors having the constants mentioned above, whereby the voltage value resulting from multiplying the setup value in the programmable power supply 12 by 1/1000 can be provided.

Expression (1) for finding the output voltage V2 is as follows:

$$V2 = \frac{R2 \times R4/(R2+R4)}{R2 \times R4/(R2+R4) + R1} \times V4 = \frac{1}{1000}V4 \qquad (1)$$

Next, the portion of the addition circuit 14 will be discussed.

The buffer amplifier IC1 is connected to the output of the programmable power supply 11 and the output of the buffer amplifier IC1 is V1.

The buffer amplifier IC2 is connected to the output of the programmable power supply 12.

The resistors R1 and R2 making up the attenuator circuit 13 are connected to the output of the buffer amplifier IC2, and output passing through the attenuator circuit 13 is V2.

The output voltages V1 and V2 can be connected to the addition circuit 14 made up of R3, R4, R5, and IC3 for providing output voltage V3 having a high resolution that cannot be provided by using only one programmable power supply.

In the example:

$R3 = 10\text{k}\Omega \pm 0.01\%$ $R4 = 10\text{k}\Omega \pm 0.01\%$ $R5 = 10\text{k}\Omega \pm 0.01\%$ As the operational amplifier IC3, LT1007 manufactured by LINEAR TECHNOLOGY is used. Expression (2) for finding the output voltage V3 is as follows:

$$V3 = \left(-\frac{R5}{R3}V1 - \frac{R5}{R4}V2\right) = -R5\left(\frac{V1}{R3} + \frac{V2}{R4}\right) \qquad (2)$$

As R3, R4, R5=10 kΩ, expression (1) is assigned to expression (2) to find expression (3).

$$V3 = -(V1 + V2) = -\left(V1 + \frac{V4}{1000}\right) \quad (3)$$

Next, the portion for monitoring the input voltage of the AD converter IC4 will be discussed.

The output voltage V3 passing through the addition circuit 14 is measured with the digital multimeter 15 and the measurement value is input through the GPIB interface 16 to the computer 19.

The measurement value is compared with the previously programmed expected value and the setup voltages of the programmable power supplies 11 and 12 are changed so as to correct the error component.

Then, the AD converter conversion start signal is transmitted through the I/O interface 21 for starting the conversion operation.

The input signal level of the AD converter IC4 is always monitored. If it is larger than the expected value, the output voltages of the programmable power supplies 11 and 12 are lowered and if it is smaller than the expected value, the output voltages of the programmable power supplies 11 and 12 are raised, whereby circuitry less affected by the measurement system error can be provided.

The error canceling-out operation is repeated in a short time of about one second or less, whereby output voltage V3 less affected by a temperature drift, etc., and close to the precision of the digital multimeter can be generated.

Figure 3:
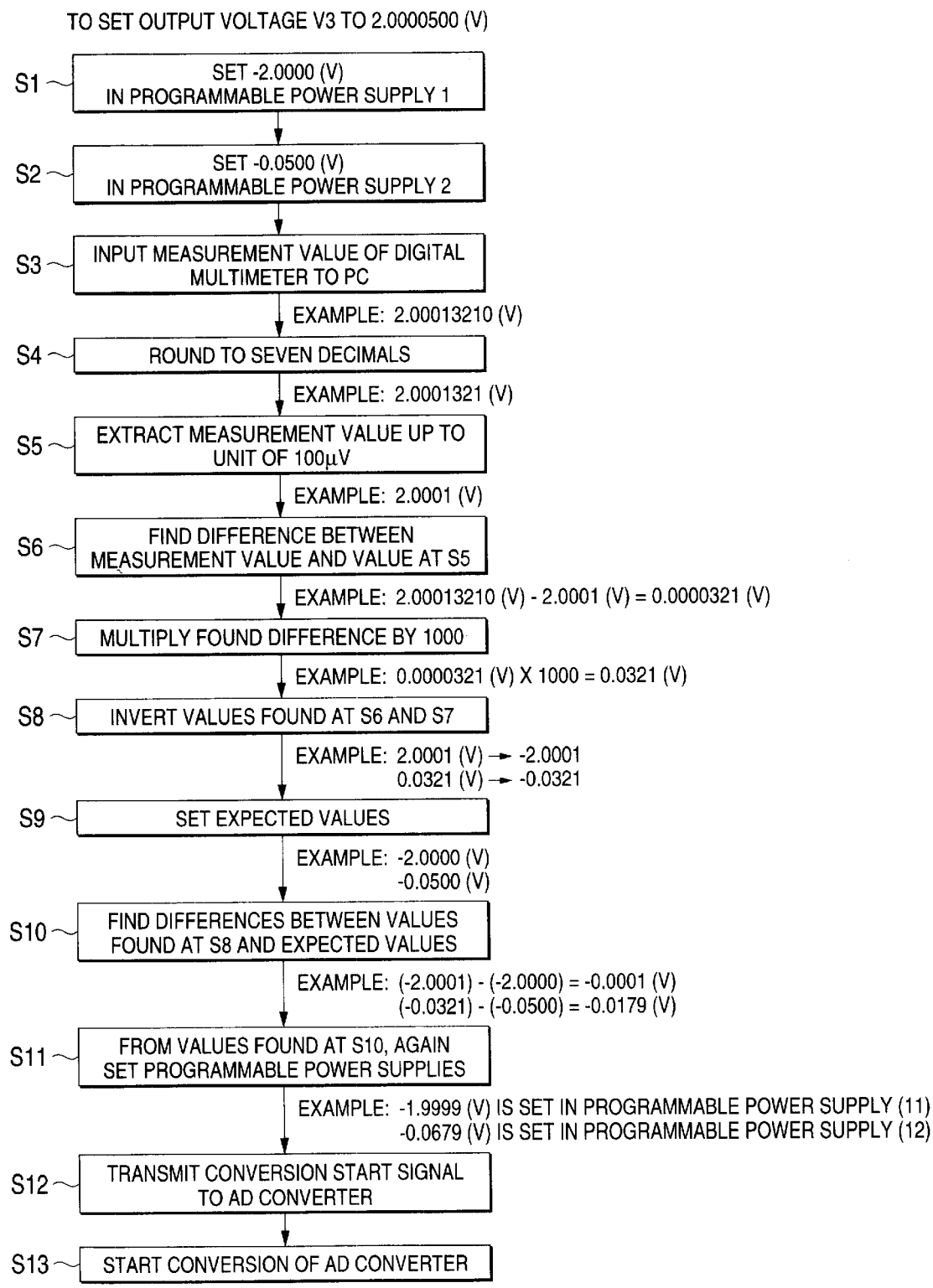
FIG. 3 is a flowchart of a measurement method of the example of the AD converter evaluation apparatus of the embodiment according to the invention.
Figure 4:
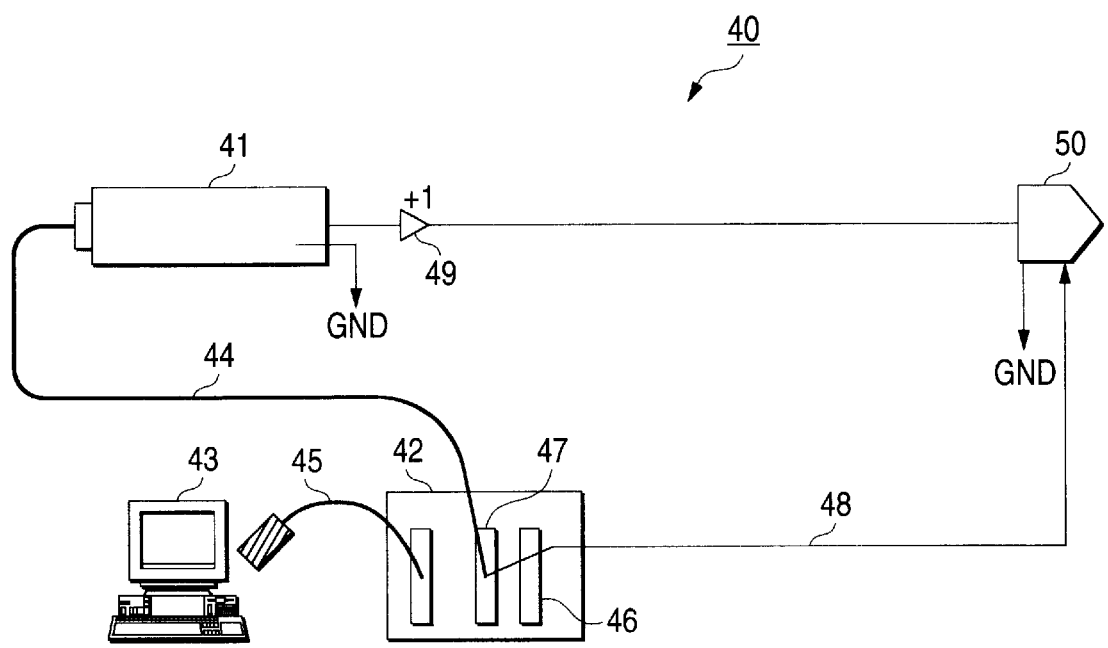
FIG. 4 is a block diagram to show an AD converter evaluation apparatus in a related art.

Next, FIG. 3 is a flowchart of a setting program and an example of a measurement method of the AD converter evaluation apparatus will be discussed with reference to FIG. 3.

The example shown in FIG. 3 is to set the output voltage V3 to 2.0000500 (V).

Step S1

Since the number of display digits of the programmable power supply 11 is 4 and ½ (100 μV), voltage is set up to the unit of 100 μV.

The addition circuit 14 uses the inverting amplifier as shown in Expression (3) and thus the polarity is inverted.

The setup voltage of the programmable power supply 11 is −2.0000 (V).

Step S2

Output voltage in the range of 10 μV to 100 nV that cannot be set in the programmable power supply 11 is set in the programmable power supply 12.

However, since the number of display digits of the programmable power supply used this time is 4 and ½ (100 μV), as mentioned above, as shown in FIG. 2, the buffer amplifier IC2 is followed by the attenuator circuit 13 for multiplying the setup voltage V4 of the programmable power supply 12 by ¹⁄₁₀₀₀ according to Expression (1).

Therefore, the setup voltage of the programmable power supply 12 is 0.000500 (V)×1000=0.0500 (V) and since the addition circuit 14 uses the inverting amplifier as shown in Expression (3) and thus the polarity is inverted.

Thus, the setup voltage of the programmable power supply 12 becomes −0.0500 (V).

Step S3

The setup voltage values (−2.0000 (V) and −0.0500 (V)) found at steps S1 and S2 are set in the programmable power supplies 11 and 12 respectively and measurement is started.

The output voltages of the programmable power supplies 11 and 12 thus set are measured with the digital multimeter 15.

In the example, the measurement value of the digital multimeter 15 is 2.00013210 (V).

Step S4

The measurement value of the digital multimeter 15 is rounded to seven decimals as follows:

2.00013210 (V)→2.0001321 (V)

Step S5

To make an error component correction to the programmable power supply 11, the measurement value of the digital multimeter 15 at step S4 is extracted up to the unit of 100 μV.

2.0001321→2.0001 (V)

Step S6

Since the addition circuit 14 uses the inverting amplifier as shown in Expression (3), the polarity is inverted.

2.0001→−2.0001 (V)

Next, in the programmable power supply 12, to correct the measurement value in the range of 10 μV to 100 nV that cannot be set in the programmable power supply 11, the value found at step S5 is subtracted from the measurement value.

2.0001321 (V)−2.0001 (V)=0.0000321 (V)

Step S7

Next, the output of the programmable power supply 12 is multiplied by ¹⁄₁₀₀₀ by the attenuator circuit 13 from Expression (1) and thus the value found at step S6 is multiplied by 1000.

0.0000321 (V)×1000=0.0321 (V)

Step S8

Since the addition circuit 14 uses the inverting amplifier from Expression (3), the value found at step S7 is inverted.

0.0321 (V)→−0.0321 (V)

Step S9

In the embodiment, to correct the error so that the output voltage V3 becomes 2.0000500 (V), the expected value at step S6 is set to −2.0000 (V) and the expected value at step S8 is set to −0.0500 (V).

Step S10

The difference between the measurement value found at step S6 and the expected value −2.0000 (V) is found.

(−2.0001)−(−2.0000)=−0.0001 (V)

Likewise, the difference between the measurement value found at step S8 and the expected value −0.0500 is found.

(−0.0321)−(−0.0500)=+0.0179 (V)

Step S11

From step S10, −1.9999 (V) resulting from subtracting 100 μV from the current setup value (−2.0000) is again set in the programmable power supply 11.

From step S6, −0.0679 (V) resulting from adding −17.9 mV to the current setup value (−0.0500) is again set in the programmable power supply 12.

Step S12

The conversion start signal is transmitted to the AD converter IC4.

Step S13

The AD converter IC4 starts the conversion operation.

According to the invention, there can be provided an AD converter evaluation apparatus for evaluating an AD converter, comprising a first programmable power supply for setting a voltage, a second programmable power supply for setting a voltage, an attenuator circuit for dividing output voltage of the second programmable power supply, an addition circuit for adding output voltage of the first programmable power supply and output voltage of the attenuator circuit, and a digital multimeter for measuring the output voltage of the first programmable power supply and the output voltage of the second programmable power supply, characterized in that output voltage of the addition circuit is input to the AD converter, so that higher-resolution programmable power supply can be realized.

According to the invention, the AD converter evaluation apparatus further comprises a computer and a controller being connected to the computer and connected through an interface section to the digital multimeter and the AD converter, wherein the controller can control the AD converter, so that the AD converter evaluation apparatus can be automatically controlled.

According to the invention, in the AD converter evaluation apparatus, the output voltage of the addition circuit is measured with the digital multimeter and the actual measurement voltage value is input to the computer, the input actual measurement voltage value is compared with an expected voltage value previously programmed in the computer, the difference between the actual measurement voltage value and the expected voltage value is found and the voltage values of the first and second programmable power supplies are again set, thereby canceling out the error component, the voltage values of the first and second programmable power supplies again set are input to the AD converter, and an AD converter conversion start signal is transmitted from the controller for starting the conversion operation of the AD converter, so that the measurement error can be canceled out and output voltage close to the precision of the digital multimeter can be provided.

What is claimed is:

1. An AD converter evaluation apparatus for evaluating an AD converter, comprising:
    a first programmable power supply for applying a first voltage;
    a second programmable power supply for applying a second voltage;
    an attenuator circuit for attenuating the second voltage output from the second programmable power supply to generate a third voltage;
    an addition circuit for adding the third voltage of the attenuator circuit to the first voltage output from the first programmable power supply to generate a fourth voltage for input to the AD converter; and
    a digital multimeter for measuring the first voltage of the first programmable power supply and the second voltage of the second programmable power supply.

2. The AD converter evaluation apparatus as claimed in claim 1, further comprising:
    a computer; and
    a controller connected to the computer and connected through an interface section to the digital multimeter and the AD converter, the controller for controlling the AD converter.

3. The AD converter evaluation apparatus as claimed in claim 2, wherein the digital multimeter measures the fourth voltage of the addition circuit and outputs an actual measured voltage of the fourth voltage to the computer.

4. The AD converter evaluating apparatus as claimed in claim 3, wherein the computer compares the actual measured voltage with an expected voltage of the fourth voltage programmed in the computer in advance to calculate a difference between the actual measured voltage and the expected voltage.

5. The AD converter evaluating apparatus as claimed in claim 4, wherein the computer resets the first and second voltages of the first and second programmable power supplies, thereby to cancel out an error component thereof.

6. The AD converter evaluating apparatus as claimed in claim 5, wherein the reset first and second voltages of the first and second programmable power supplies are for input to the AD converter; and
    the controller transmits an AD converter conversion start signal to start conversion operation of the AD converter.

7. The AD converter evaluating apparatus as claimed in claim 1 wherein, during operation, the attenuator circuit attenuates the second voltage by a plurality of orders of magnitude.

* * * * *